United States Patent [19]

Bennett

[11] 4,358,737
[45] Nov. 9, 1982

[54] DIGITALLY CONTROLLED BANDWIDTH SAMPLING FILTER-DETECTOR

[75] Inventor: Robert M. Bennett, Ham Lake, Minn.

[73] Assignee: Motorola, Inc., Schaumburg, Ill.

[21] Appl. No.: 197,407

[22] Filed: Oct. 16, 1980

[51] Int. Cl.³ .................... H03K 9/06; H03K 17/16
[52] U.S. Cl. ................... 328/138; 328/151; 328/167
[58] Field of Search ............... 328/138, 151, 165, 167

[56] References Cited

U.S. PATENT DOCUMENTS

| | | | |
|---|---|---|---|
| 3,537,019 | 10/1970 | Reichard | 328/165 |
| 3,604,947 | 9/1971 | Puthuff | 328/167 |
| 3,786,360 | 1/1974 | Kawa | 328/151 |
| 4,024,414 | 5/1977 | Gurry | 328/138 |
| 4,127,824 | 11/1978 | Bennett | 328/138 |
| 4,319,207 | 3/1982 | Gignoux | 328/151 |

*Primary Examiner*—John S. Heyman
*Attorney, Agent, or Firm*—James A. Scheer; James W. Gillman

[57] ABSTRACT

An improved sampling filter detector circuit for sampling input signals of different frequencies and providing a detect signal when the input frequency has a desired predetermined value. The circuit is suitable for use as a tone detector for continuous tone control squelch systems. The sampling filter detector substantially eliminates response to low order harmonics of the desired frequency and provides the ability to program the filter detector bandwidth by digital means without altering passive components thereby permitting reverse burst detection.

10 Claims, 6 Drawing Figures

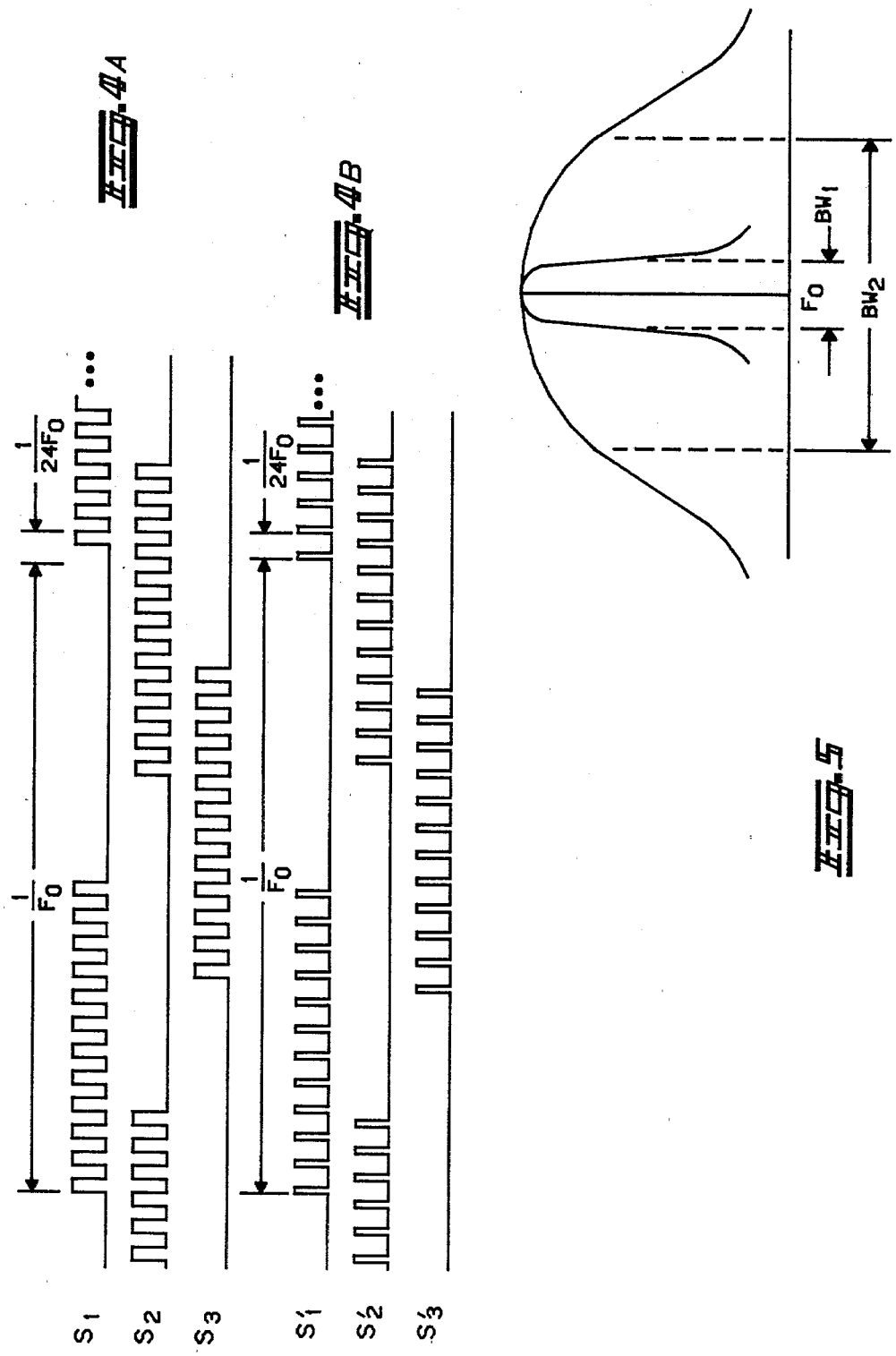

DIGITALLY CONTROLLED BANDWIDTH SAMPLING FILTER-DETECTOR

BACKGROUND OF THE INVENTION

1. Field of the Invention

This invention relates generally to the electronic signal processing art and, in particular, to an improved sampling filter detector utilizing capacitive storage and suitable for tone control squelch systems.

2. Description of the Prior Art

As a result of the extensive use of radio communication channels presently available, it has become common practice, especially in heavily populated metropolitan areas, to have several communication systems operating on a common radio channel. Operators whose radios are not equipped with some form of tone squelch must listen to all conversations on the channel from transmitters that are within range. This is both annoying and fatiguing for the operators. The use of tone squelch to alleviate the annoyance is a common solution to the problem. A standard for sub-audible continuous tone control squelch systems (CTCSS) is covered in an Electronic Industries Association (EIA) Standard RS 220-A, published in March, 1979.

Basically, such systems operate by equipping each radio transmitter in the particular radio system with a tone encoder operating on one of the 33 standard EIA channels between 67.0 and 250.3 Hz. When the transmitter is keyed, the operator's voice modulates the transmitter in the 300-3000 Hz range and simultaneously with the voice, the sub-audible tone modulates the transmitter as well.

Receivers within the radio system are equipped with a frequency selective device (tone decoder) tuned to the same tone frequency as the tone encoder within the transmitters of the system. This tone decoder normally holds the receiver in the squelched mode. If a received signal is not modulated with the tone or is modulated with a tone that is not on the decoder frequency, then the receiver will remain squelched and the operator will not hear the interference. If a transmission is received having a tone corresponding to the frequency of the tone decoder, the receiver will be unsquelched and the operator will receive the message.

Numerous other applications are possible using subaudible tone, such as, control of radio repeaters, identifying a particular vehicle out of a plurality of vehicles, alarm and control signal applications, switching the radio receiver or transmitter frequencies, switching communication circuits, etc.

Many of the tone squelch systems now being manufactured employ vibrating mechanical resonant reeds. Resonant reed systems suffer from a number of problems. In order to reprogram such a system, the resonant reed must be replaced by a reed of another frequency. Long lead times are involved as service organizations rarely stock the 33 types of encoding and decoding reeds required for this type of change. In addition, vibrating mechanical resonant reeds suffer from short life and false operation when subject to vibrations encountered in vehicular two-way radio service.

Until recently it was difficult to employ electronic means for decoding these low tone frequencies. One approach would be to utilize a sampling filter detector such as that disclosed in a patent to Robert M. Bennett (U.S. Pat. No. 4,127,824) and assigned to Motorola, Inc. That detector, however, is susceptible to substantial harmonic response and lacks flexibility in that it is difficult to modify the bandwidth. This makes it unsuitable for tone coded squelch applications.

Solutions for these and other problems are provided by the instant invention which is a digitally controlled bandwidth sampling filter detector.

SUMMARY OF THE INVENTION

It is an object of the invention to provide an improved sampling filter detector with digitally controlled bandwidth suitable for use with subaudible continuous tone controlled squelch systems.

It is another object of the invention to provide an improved sampling filter detector with reduced response to low order harmonics of the detect frequency.

It is yet another object of the invention to provide an improved sampling filter detector which is particularly suitable for monolithic integration.

It is still another object of the invention to provide an improved sampling filter detector which minimizes sensitivity to vibration in sub-audible continuous tone controlled squelch systems.

Briefly, according to one embodiment of the invention, an improved sampling filter is provided for processing a signal applied to an input terminal to detect at least one desired tone of a plurality of tones. The resistor is coupled to the input terminal and a plurality of switch means are coupled to the resistor, each switch means including an output and a control input. At least one capacitor is coupled to the output of each switch means and each capacitor is coupled to a reference voltage, such as ground. A control means is coupled to the switch means control inputs, for activating each switch means for switching time period equal to approximately one-half the period of the desired tone, with each switch means successively opened and closed at a frequency substantially higher than the frequency of the desired tone during its switching period, and so that no more than one switch means is closed at any time. A peak voltage follower and a valley voltage follower each having inputs and an output, have an input coupled to each of the capacitors. A comparator means is coupled to the output of the voltage peak follower and the output of the voltage valley follower for providing a detector output when one of the outputs of the peak and valley followers exceeds the other.

According to another feature of the invention, the time that each switch means is in the closed condition during each switching period is programmable to at least two values.

BRIEF DESCRIPTION OF THE DRAWINGS

The features of the present invention which are believed to be novel are set forth with particularity in the appended claims. The invention together with further objects and advantages thereof, may best be understood by reference to the following description when taken in conjunction with the accompanying drawings.

FIGS. 4A and 4B show a series of timing waveforms developed at the outputs of the phase control circuit shown in FIG. 2.

FIG. 5 is a set of response curves illustrating the typical bandwidth characteristics attainable by the inventive sampling filter detector.

DESCRIPTION OF THE PREFERRED EMBODIMENT

Figure 1:
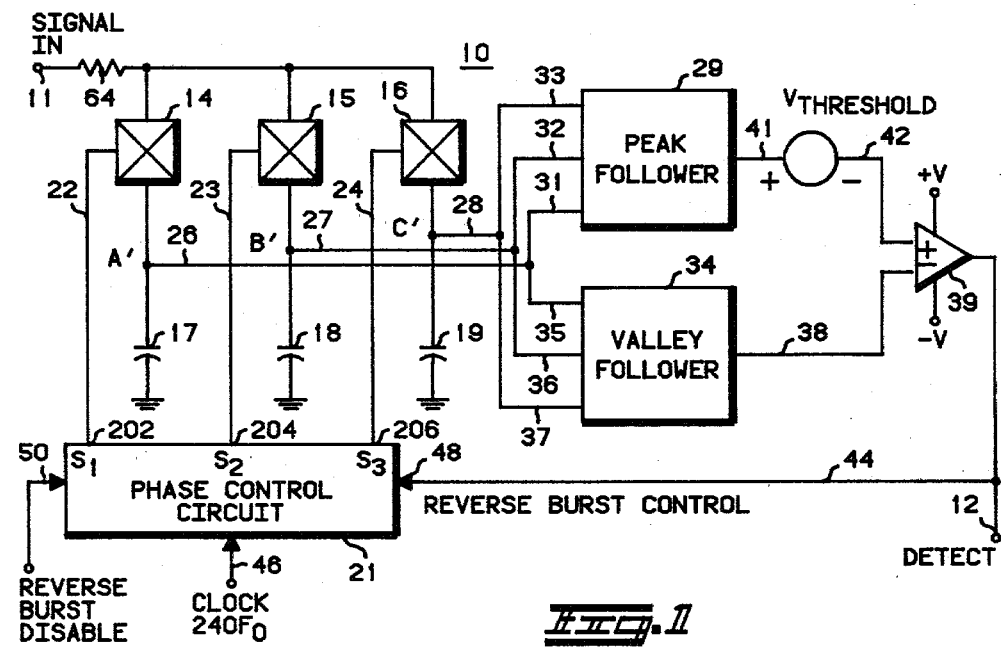
FIG. 1 is a block diagram illustrating one embodiment of the inventive controlled bandwidth sampling filter detector.

Referring to FIG. 1 of the drawings, there is shown a sampling filter detector circuit 10 to which an input signal is applied at terminal 11. The sampling filter detector circuit 10 develops a detect signal at an output terminal 12. The input signal applied to the input terminal 11 is sampled by solid state switches 14, 15 and 16, and the samples are stored in capacitors 17, 18 and 19, respectively. It should be noted that the function of the solid state switches 14, 15 and 16 is equivalent to that of multipliers. The solid state switches 14, 15 and 16 may be field effect transisitors, bipolar transistors or other devices known to those skilled in the art. The terminals of the capacitors opposite the switches are connected to a reference potential which, as shown, can be ground. The solid state switches 14, 15 and 16 are turned on and off at the appropriate time intervals by pulses developed in the phase control circuit 21 coupled through conductors 22, 23 and 24, respectively.

The voltages appearing on the capacitors 17, 18 and 19 are coupled through conductors 26, 27 and 28 and through conductors 31, 32 and 33 to a voltage peak follower 29. The voltage on the capacitor 17, 18 and 19 are also coupled through conductors 26, 27, 28 and through conductors 35, 36 and 37 to a voltage valley follower 34. The output of the voltage valley follower 34 is coupled through a conductor 38 to the inverting input of a differential amplifier 39 and the output of the voltage peak follower 29 is coupled through conductors 41 and 42 to the non-inverting input terminal of a differential amplifier 39. A voltage, $V_{threshold}$, is connected between the conductors 41 and 42 in order that the threshold at which the differential amplifier 39 will change from no signal at the output terminal 12 to a high signal at the output terminal 12 may be predetermined. Essentially the signal at the output terminal 12 is a logical zero or a logical 1 depending upon the value of the threshold and the voltage values on the capacitors 17, 18 and 19, as will be more fully explained.

The digital phase control circuit 21 is driven by a clock at the clock terminal 46 with a frequency of 240 $F_0$, where $F_0$ is the frequency of the desired tone. A conductor 44 couples the output terminal 12 to the reverse burst control terminal 48 of the phase control circuit 21. In addition, a reverse burst disable input 50 is provided.

Figure 2:
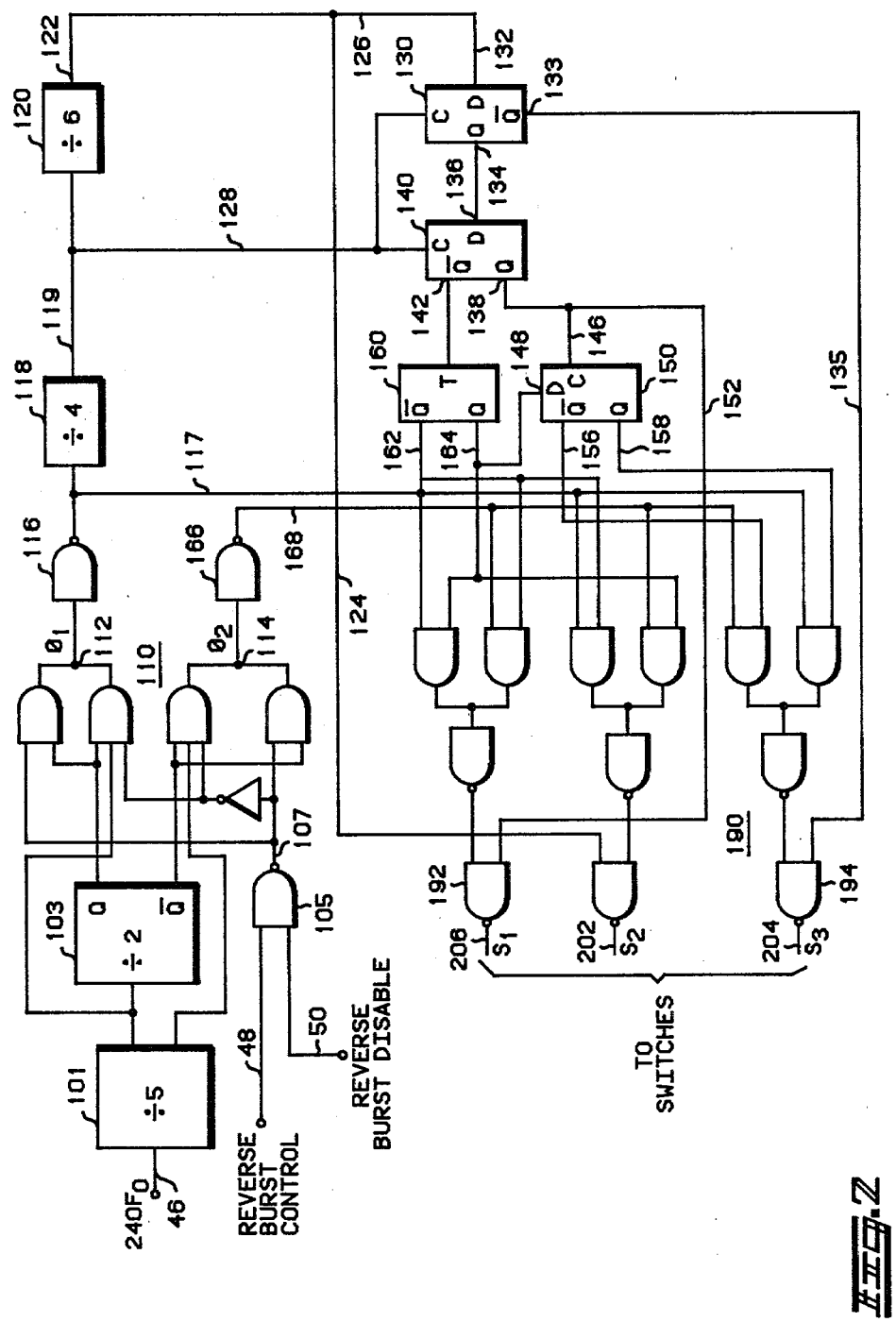
FIG. 2 is a detailed diagram of the phase control circuit shown in FIG. 1.

Referring now to FIG. 2, there is shown a detailed diagram of the phase control circuit 21 shown in FIG. 1. A clock signal equal to 240 $F_0$ is applied to the clock terminal 46 and directly to a divide-by-five divider 101. The output of the divider 101 is applied to a divide-by-two divider 103 and the output of both dividers 101, 103, is coupled to a gating network indicated generally by the reference numeral 110. In addition, an AND gate 105 is provided having a reverse burst control input 48, and a reverse burst disable 50. The output 107 of the AND gate 105 is also coupled to the gating network 110. As a result of the division of the clock signal applied to the clock terminal 46 by the dividers 101, 103, two signals are generated at the outputs 112, 114 of the gating network 110 with a frequency 1/10 of the clock frequency (i.e. 24 $F_0$). These two signals, $0_1$ and $0_2$, are 180° out of phase due to the action of the gating network 110 which functions in a manner well known in the digital logic art. The functioning of the gates of the gating network 110 is believed to be sufficiently well understood in this art without the requirement of illustrating the truth table for these devices or other more detailed explanation.

Figure 3:
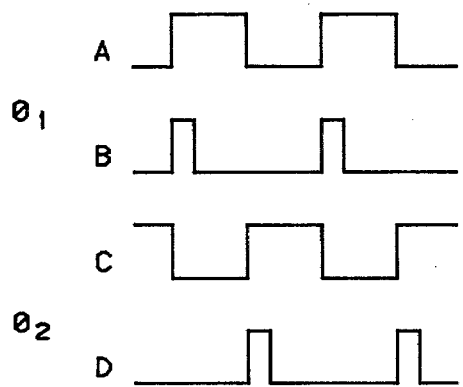
FIG. 3 is a series of typical waveforms generated within the circuitry of the phase control circuit illustrated in FIG. 2.

When a low logic level is applied to the reverse burst disable input 50, the output 107 of the AND gate 105 will always be low (i.e. gate 105 will be disabled). This will result in the waveforms $0_1$ and $0_2$ having the form of waveforms B and D as shown in FIG. 3, respectively. When a high logic level is applied to the reverse burst disable 50, the output 107 of the AND gate 105 will be low if the reverse burst control terminal 48 is low and high when the reverse burst control terminal 48 is high (i.e. gate 105 will be enabled). Thus, with the reverse burst control terminal low, the waveforms at the outputs 112, 114 of the gating network 110 will be the waveforms B and D of FIG. 3 as described above. However, with the reverse burst control terminal high, the waveforms $0_1$ and $0_2$ at the outputs 112 and 114 will be such as those shown as waveforms A and C in FIG. 3. Waveforms A and C of FIG. 3 have a duty cycle of 50% while the waveforms B and D of FIG. 3 have a duty cycle of 10%. Thus, when the AND gate 105 is enabled by a high on the reverse burst disable input 50, two waveforms, each with a frequency 24 $F_0$, and each 180° out of phase, will be generated at the outputs 112 and 114 of the gating network 110, and each will have a duty cycle of 10% when the reverse burst control input 48 is low, or a duty cycle of 50% when the reverse burst control input 48 is high.

The waveform $0_1$ at the gating network output 112 is coupled through an inverter 116 to a divide-by-four divider 118, as shown. The output 119 of the divider 118 is coupled to a divide-by-six divider 120. The combination of the dividers 118 and 120 form a divide-by-24 divider and therefore the output signal at the output 122 of the divider 120 is a waveform with a frequency $F_0$. This signal is coupled to the D input 132 of a flip-flop 130. The Q output 134 of the flip-flop 130 is coupled, as shown, to the D input of another flip-flop 140 and the $\overline{Q}$ output 133 is coupled via a conductor 135 to a NAND gate 194 of a gating network indicated generally by the reference numeral 190. In addition, the output 119 of the divider 118 is coupled to the clock inputs of the flip-flops 130 and 140. The Q output 138 of the flip-flop 140 is coupled to the clock input 146 of a flip-flop 150 and coupled via a conductor 152 to a NAND gate 192 of the gating network 190. The $\overline{Q}$ output 142 of the flip-flop 140 is coupled to the T input of a flip-flop 160 and the Q output 154 of the flip-flop 160 is coupled to the D input 148 of the flip-flop 150, as shown. These flip-flops 130, 140, 150 and 160 provide timing and phase adjust waveforms to the gating network 190. The output waveforms from the flip-flops 150 and 160 are coupled to the gating network through conductors 156, 158, 162 and 164, as shown. In addition, as described above, a signal of frequency $F_0$ (i.e. frequency of the desired tone) is generating at the output 122 of the divider 120. This signal is coupled to the gating network 190 via a conductor 124 as shown. The waveform $0_1$, which has a frequency of 24 $F_0$, is coupled to the gating network 190 through the inverter 116 and via a conductor 117 and the waveform $0_2$ also having a frequency of 24 $F_0$ is coupled to the gating network 190 through an inverter 166 and via a conductor 168, as shown. The gating network, provided with the timing and phase adjust signals, fundamental frequency $F_0$ and the signals $0_1$ and $0_2$ of the frequency 24 $F_0$, generate the signals S1, S2 and S3 at the outputs 202, 204 and 206, respectively, such as those shown in FIGS. 4A and 4B. The functioning of the gates of the gating network 190 is believed to be sufficiently well understood in this art without the requirement of illustrating the truth tables for these devices or other more detailed explanation.

It should be noted that each waveform S1, S2 and S3 is composed of a switching period made up of a rectangular switching waveform with a frequency of 24 $F_0$. In addition, each switching period is approximately one-half of the fundamental frequency of the desired tone $F_0$. Also, the waveforms S1, S2 and S3 of both FIGS. 4A and 4B are so phased that they overlap each other by 60° of the period of the fundamental frequency and are interleaved so that only one of the waveforms S1, S2 or S3 is at a high level at any time.

The waveforms shown in FIG. 4A are those which are generated at the output 202, 204 and 206 when the waveforms $0_1$ and $0_2$ have a 50% duty cycle, which as described above, occurs when the reverse burst control input 48 is high and the reverse burst disable input 50 is high. The waveforms S1, S2 and S3 of FIG. 4B are those generated at the outputs 202, 204 and 206, respectively when the waveforms $0_1$ and $0_2$ have a 10% duty cycle. As described above, this occurs when the reverse burst control input 48 is low or when the reverse burst disable input 50 is low. These waveforms S1, S2 and S3 at the outputs 202, 204 and 206 are coupled as shown in FIG. 1 over the conductors 22, 23 and 24 to control the closing and opening of the switches 14, 15 and 16, respectively. In each case, the switch will be turned on (i.e. closed) when the pulses of the waveforms S1, S2 and S3 are high and will be turned off (i.e. open) when the pulse drops to zero. The high level of the pulses can be considered as logical 1's and the low level as logical 0's in the digital logic circuitry of the phase control circuit 21. Thus, each of the switches 14, 15 and 16 are successively opened and closed over a switching period equal to one-half the period of the desired tone frequency $F_0$ and remain open during the other half of the period $F_0$.

As a result, it can be seen that the function of the phase control circuit 21 is to successively open and close the solid state switches 14, 15 and 16 (12 times in this embodiment) for 180° intervals of the frequency $F_0$ which is the tone frequency to be detected. In addition, by the appropriate choice of logic input levels to the inputs 50 and 48, shown in FIG. 1, a duty cycle of 50% or 10% can be programmed for the switching function. Thus, the total time that each switch is closed during its switching period can be digitally programmed to either 50% to 10% of the switching period. Finally, the waveforms S1, S2 and S3 will assure that no more than one switch 14, 15 or 16 will be closed at any time since no more than one waveform is at a logical one at any time.

Inasmuch as the positive pulses turn on the switches, it can be observed by reference to FIG. 1 and FIG. 4A, that switch 14 is open and closed 12 times during a switching period of 180° of $F_0$, and opened for the remainder of the cylce, followed by the switch 16 being opened and closed by the waveform S3 for 180°, and overlapping the switch period of switch 14 by 60 degrees. Finally, switch 15 is opened and closed by waveform S2 for 180° of $F_0$ and overlaps the switch period of switch 16 by 60° and the next switching period cycle of switch 14 by 60 degrees. It is essential as will be described later, that no more than one switch be closed at any one time but the order in which the switches are activated is not critical. Thus, it should be noted that the positive pulses of S1, S2 and S3, are interleaved so that during overlapping intervals, only one waveform is at a logical one level at any time.

Assuming an input signal is applied to the input 11 of FIG. 1, then during the initial 180° switching period the capacitor 16 is charged to some positive average value due to the repeated closing of switch 14. Similarly, during the succeeding 180° switching intervals the capacitor 19 will assume a charge of some average value and during a third switching period of 180° the capacitor 18 is charged to some average value. It is understood, of course, that the process repeats at the drive frequency $F_0$.

The peak voltage follower 29 (see FIG. 1) which may be of any well known type, but could be a series of appropriately poled diodes, follows peak voltage as received over the conductors 31, 32 and 33, providing a plus output voltage at the conductor 41. The voltage valley follower 34, which also may be of any well known type, for example, a series of properly poled diodes, follows the voltage valleys as received over the conductors 35, 36 and 37, providing a negative output voltage at conductor 38. The difference between the valley voltages and the peak voltages as modified by the threshold voltage $V_{threshold}$ is applied to the inverting and noninverting terminals of the high gain differential amplifier 39 as already explained. The threshold can be selected to be any desired value such that when the difference between the peak voltages and the valley voltages exceeds the threshold, the amplifier 39 will supply a detect signal. When the difference between the peak voltages and the valley voltages is less than the threshold, there will be no detect output signal at terminal 12. In other words, when the frequency of the input signal is within the bandwidth, and of sufficient amplitude, there will be a high output signal, which can be a logical 1. Whenever the input signal is not within the bandwidth, the differences between peak voltages and valley voltages will be less than the necessary differential and the output of the amplifier 39 will be low or a logical 0.

It should be noted that if more than one switch was closed at any one time, that the effected capacitors would be charged to some common value, and since the sampling filter detector relies on the difference between the voltage values on the capacitors, it is clearly essential that only one switch can be allowed to close at any given time. This is accomplished by the interleaving of the switching pulses.

The bandwidth of the response is determined by two factors. First, the magnitude of the resistor 64 connected to the input circuit and the capacitive values of the sampling capacitors 17, 18 and 19. The resistor and capacitor form an attenuating circuit which rapidly attenuates the output when the input frequency varies from the desired or fundamental frequency. (A typical resistor value is 15 K-ohms and a typical value is 0.1 microfarads). The second determining factor establishing the bandwidth is the duty cycle of the pulses during the switching period and therefore the total time that each switch is closed during each switching period. This is due to the fact that the Q of the circuit is directly proportional to the amount of time that each capacitor is permitted to charge during each switching period. As a result, the shorter the duty cycle of the switching waveform during each switching period, the higher the Q of the circuit and therefore the narrower the bandwidth. In fact, the bandwidth is inversely proportional to the duty cycle of the switching waveform during the switching period. This is illustrated in FIG. 5 for the circuit shown in FIG. 1. For the condition in which the reverse burst disable 50 or the reverse burst control 48 are low, as described above, the duty cycle of the switching waveform will be 10% and therefore the bandwidth of the sampling filter detector will be the narrow bandwidth $BW_1$, as shown in FIG. 5. When both the reverse burst disable 50 and the reverse burst control 48 are high, the duty cycle becomes 50% and the bandwidth becomes much wider to that shown as $BW_2$ in FIG. 5. Thus the bandwidth can easily be controlled by digital means without altering the passive components.

As a result (see FIG. 1), if a detect occurs resulting in a high on the detect output 12, then that high condition is coupled to the reverse burst control input 48 via the conductor 44. If a high is applied to the reverse burst disable thus enabling the reverse burst bandwidth control capability of the circuit, then the detection will cause the circuit to switch to a wide bandwidth condition. This permits the circuit of FIG. 1 to respond rapidly to a reverse burst input at the input 11. This capability permits the circuit of FIG. 1 to be used in a continuous tone control squelch system which utilizes a reverse burst for turn-off at the end of a transmission.

Standard continuous tone control squelch systems require that once a tone has been detected, the state of no detect must be reached more quickly than if the tone had simply been removed, in order to avoid annoying squelch tails. This is accomplished by using a reverse burst by suddenly shifting the tone signal by the 180 degrees. By widening the bandwidth, the circuit of FIG. 1 can respond more rapidly to this 180° phase shift, thus permitting the capacitors 17, 18 and 19 to discharge more rapidly so that the output 12 will revert to a low or no detect condition more rapidly.

The harmonic response of the sampling filter detector is determined by the switching waveforms. The sampling filter does not produce an output for any harmonic which averages to zero over the switching period. Therefore, since the switching period in this embodiment is 180° of $F_0$, no even harmonic (i.e. second, fourth, sixth, etc.) will result in an output. (It should be noted that the switching period need only be approximately 180° to provide adequate performance.) In addition, the sampling filter does not respond to DC or multiples of the third harmonic because of the common mode cancellation that exists as a result of the use of three capacitors. Thus, it can be seen that this sampling filter detector does not respond to second, third or fourth harmonics of the fundamental desired tone frequency $F_0$. This makes the circuit highly suitable for continuous tone coded squelch systems since the fifth harmonic is low enough in amplitude to not be detected and high enough in frequency to be outside the band of response for tone coded squelch systems.

All of the components described except for the resistor 64 and the capacitor 17, 18 and 19 can readily be realized in integrated form.

While a preferred embodiment of the invention has been described and shown, it should be understood that other variations and modifications may be implemented. It is therefore contemplated to cover by the present application any and all modifications and variations that fall within the true spirit and scope of the basic underlying principles disclosed and claimed herein.

What is claimed is:

1. An improved sampling filter for processing an input signal applied to an input terminal to detect at least one desired tone of a plurality of tones, comprising:
    (a) a resistor, coupled to the input terminal;
    (b) a plurality of switch means, coupled to the resistor, each switch means including an output and a control input;
    (c) an individual capacitor coupled to the output of each switch means and each capacitor coupled to a reference voltage;
    (d) control means, coupled to the switch means control inputs, for activating each switch means for a switching period equal to approximately one-half the period of the desired tone, said control means including means for successively opening and closing said switching means at a frequency higher than the product of the frequency of the desired tone multiplied by said plurality of switch means, and so that at least two switches overlap in operation but no more than one switch is closed at any time;
    (e) a peak voltage follower having inputs and an output, an input of which is coupled to each of the capacitors;
    (f) a valley voltage follower having inputs and an output, an input of which is coupled to each of the capacitors;
    (g) comparator means, coupled to the output of the peak follower and the output of the valley follower for providing a detector output when one of the outputs of said peak and valley follower exceeds the other.

2. The improved sampling filter detector according to claim 1, wherein said switching periods overlap such that there are no substantial time periods during which less than one switch is in its switching period.

3. The improved sampling filter detector according to claim 1, wherein the time that each switch means is in the closed condition during each switching period, is programmable to at least two different values.

4. The improved sampling filter detector according to claim 2, wherein the time that each switching means is in the closed condition during each switching period, is programmable to at least two different values.

5. The improved sampling filter detector according to claims 1, 2, 3 or 4, wherein a threshold determining means is provided in one of the inputs to the comparator.

6. The improved sampling filter detector according to claim 5, wherein said comparator comprises a differential amplifier.

7. The improved sampling filter detector according to claim 5, wherein there are three capacitors.

8. The improved sampling filter detector according to claim 4, wherein there are three capacitors.

9. The improved sampling filter detector according to claim 8, wherein each switching period overlaps 60 degrees of all the other switching periods and no more than two switching periods overlap at one time.

10. The sampling filter detector according to claim 8 or 9, wherein the time that each switching means is in the closed condition during each switching period is programmable to two different percentages of the switching period, said percentages being 50% and a percentage substantially less than 50%.

* * * * *